United States Patent [19]

Baker

[11] 4,015,247

[45] Mar. 29, 1977

[54] METHOD FOR OPERATING CHARGE TRANSFER MEMORY CELLS

[76] Inventor: Roger T. Baker, Box 240, Mount Tabor, N.J. 07878

[22] Filed: Dec. 22, 1975

[21] Appl. No.: 642,721

[52] U.S. Cl. .......................... 340/173 R; 307/238; 307/304

[51] Int. Cl.² .................. G11C 11/40; G11C 7/00

[58] Field of Search ............... 340/173 R; 357/24; 307/205, 238, 304

[56] References Cited

UNITED STATES PATENTS 3,720,922  3/1973  Kosonocky ................... 340/173 R
3,755,793  8/1973  Ho et al. ...................... 340/173 R

*Primary Examiner*—Stuart N. Hecker

[57] ABSTRACT

A method for representing, entering, storing, and recalling binary data from a semiconductor memory cell. Using this method, binary data is represented by the number of charge carriers stored in the two potential wells formed in a semiconducting material beneath two electrodes. The data so stored is read by opening a channel between these two potential wells, permitting carriers to flow between them, and detecting the resulting change in the potential of the two electrodes.

10 Claims, 7 Drawing Figures

METHOD FOR OPERATING CHARGE TRANSFER MEMORY CELLS

This invention relates to a method of representing, entering, storing, and recalling binary data in a semiconductor memory cell. More particularly, in the method of this invention, to represent the alternative values of a binary valued variable, a relatively large amount of charge is selectively entered and stored in one of two potential wells for such charge. The value so stored may be determined by altering the amount of charge stored in each potential well, and monitoring the resulting potential changes on two electrodes located in close proximity to the potential wells.

The terminology in general use among those skilled in the art will be used throughout this document, but it is useful to explicitly discuss several terms that will be used repeatedly. In metal insulator semiconductor (MIS) technology "depletion region" is a commonly used term, but depending somewhat on local custom and the nature of the situation under consideration it may or may not be understood to include an inversion region. Also, the term inversion may or may not be used to describe a region in which a substantial density of minority carriers may collect, but in fact, due to circumstances have not yet collected. By "substantial density of minority carriers" is meant a density of minority carriers much greater than in the field free region of the semiconductor, or a density of minority carriers comparable to the density of majority carriers characteristic of the doping of the semiconductor in the region under consideration. To simplify the description of the present invention, in this document the term depletion region will mean (unless otherwise specifically stated as for example in "a depletion region but not an inversion region") a region in the semiconductor which is substantially depleted of majority carriers and which is capable of maintaining a substantial density of minority carriers. Also, in this document "inversion region" will refer to that part of the depletion region which is capable of maintaining a substantial density of minority carriers. Similarly, "accumulation region" will refer to a region in the semiconducting material which is capable of maintaining an excess of majority carriers regardless of whether or not such an excess is actually present.

Finally, the term "charge transfer principles" as in "device based on charge transfer principles" refers to the use of potential wells established in a semiconducting material by, for example, applying an appropriate voltage to conducting electrodes in close proximity to the semiconductor, or actually in contact with the semiconductor, to control the accumulation within, or maintenance in, or flow of mobile carriers between the said potential wells. "Potential wells" refers to localized minimum potential energy regions for charge of one polarity.

Important considerations in evaluating semiconductor memories are:
1. access and cycle times,
2. power consumption of the memory and associated circuitry,
3. the semiconductor surface area required per stored bit,
4. the complexity and number of processing steps required to manufacture the memory, and
5. the complexity and extent of the support circuitry required for operation of the memory.

In the prior art charge transfer principles have been used in shift register (SR) type memories. These memories usually require a minimum of processing in their manufacture, and require a minimum of semiconductor surface area per stored bit, but because of their serial nature, and other requirements on their operation such as obtaining nearly complete charge transfer whenever charge is transferred, they may have excessive access times for some applications, and they may require extensive and complex support circuitry for their operation.

Random access memories based on charge transfer principles have been described in the prior art (see for example, Engler, W. E., et al., "A Surface Charge Random Access Memory System," IEEE Jour. of Solid State Circuits, SC-7, pp. 330–335, 1972), but the operation of such devices differs from the present invention, and generally the devices which are used in such memories differ from the devices used in implementing the present invention. Also, a parallel arrangement of a plurality of shift registers may be utilized to form a line addressable memory (see for example, Gunsager, K. C., et. al., "A CCD Line Addressable Random Access Memory (LARAM)," IEEE Jour. of Solid State Circuits, SC-10, pp. 268–273, 1975, but even if such memories are constructed using devices based on charge transfer principles, and even in the limiting case where the shift registers of the line addressable memories consists of only one stage or cell capable of storing only one bit, the operation of such memories differs from the present invention, and the structures used in such memories differ from the structure used in the implementation of the present invention.

Metal insulator semiconductor field effect transistors (MISFETs) and bipolar transistor along with other elements, or parasitic elements, such as capacitors can also be used to form semiconductor memories. In particular, when used to form dynamic random access memories, even though the processing complexity in their manufacture, and the semiconductor surface area per stored bit may exceed that of SR's such dynamic random access memories are valuable for many applications because of their fast access times and other operation features characteristic of random access memories.

Accordingly, it is an object of this invention to provide a method for representing, entering, storing, and recalling binary data which can be used in random access memories and which can be implemented using charge transfer devices so as to require a minimum of semiconductor surface area per stored bit.

It is another object of this invention to provide a method for representing, entering, storing, and recalling binary data which can be used in random access memories and which can be implemented using charge transfer devices to benefit from the simplicity of manufacture characteristic of charge transfer devices.

It is another object of this invention to provide a method for representing, entering, storing, and recalling binary data which can be used in random access memories and in which cycle and access times are minimized.

It is another object of this invention to provide a method for representing, entering, storing, and recalling binary data which can be used in random access memories and by which differential outputs may be obtained from the cell when it is read.

It is another object of this invention to provide a method for representing, entering, storing, and recalling binary data which can be used in random access memories by which the potentially fast operating speeds of charge transfer devices when such devices operate in a mode not requiring almost complete charge transfer in every cycle, may be utilized.

It is another object of this invention to provide a method for representing, entering, storing, and recalling binary data which can be used in random memories and in which a minimum of support circuitry is required.

It is another object of this invention to provide a method for representing, entering, storing, and recalling binary data which can be used in random access memories in which minimized power is consumed in entering data in to, retaining data in, and recalling data from the cell.

The foregoing and other objects, features and advantages of this invention will be apparent from the following more particular description of the preferred embodiments of the invention as will be described using the structures illustrated in the accompanying drawings.

Figure 1:
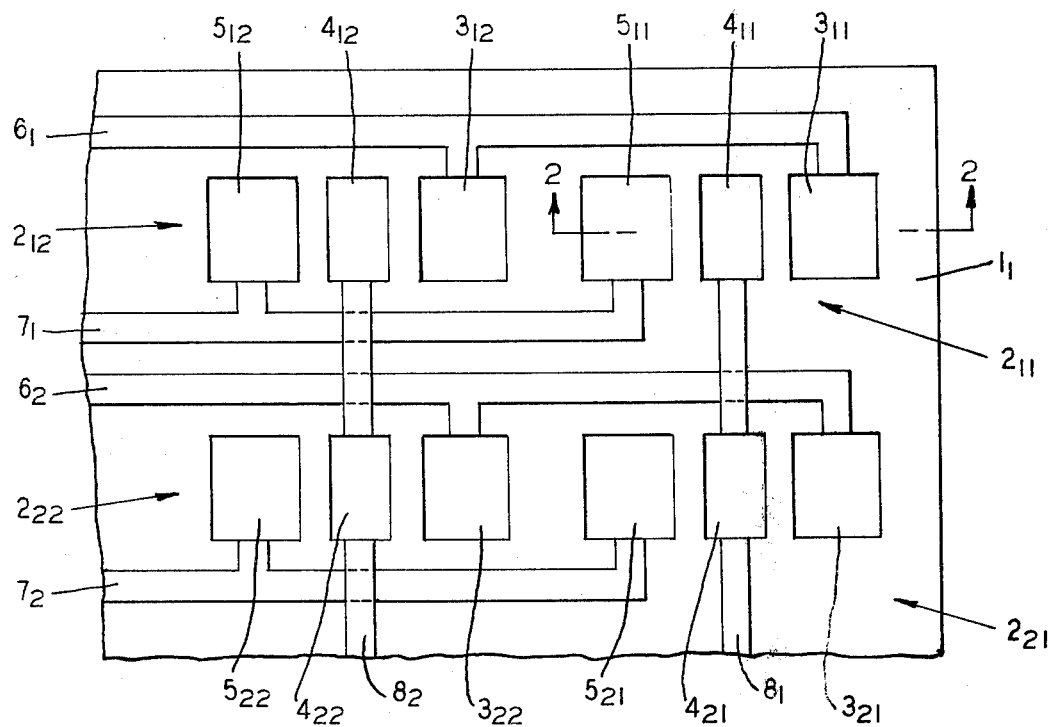
FIG. 1 is a top view illustrating a portion of an array of memory cells which can be operated according to the present invention.

FIG. 1 is a top view of a portion of a wafer 1 in which N × M memory cells $2_{11}$, $2_{12}$, ... $2_{NM}$ all having substantially the same size and electrical characteristics, form a two dimensional array. Each cell $2_{11}$, $2_{12}$, ... $2_{NM}$ appears in one row, which determines the first subscript of the reference numerals associated with that cell, and appears in one column, which determines the second subscript of the reference numerals associated with that cell. Each cell $2_{11}$, $2_{12}$, ... $2_{NM}$ includes an A electrode $3_{11}$, $3_{12}$, ... $3_{NM}$, a gate electrode $4_{11}$, $4_{12}$, ... $4_{NM}$, and a B electrode $5_{11}$, $5_{12}$, ... $5_{NM}$. Each A electrode $3_{11}$, $3_{12}$, ... $3_{NM}$ is electrically connected to the A row line $6_1$, $6_2$, ... $6_N$ corresponding to the row in which the cell $2_{11}$, $2_{12}$, ... $2_{NM}$ appears, and has its B electrode $5_{11}$, $5_{12}$, ... $5_{NM}$ connected to the B row line $7_1$, $7_2$, ... $7_N$ corresponding to the row in which the cell $2_{11}$, $2_{12}$, ... $2_{NM}$ appears. Each gate electrode $4_{11}$, $4_{12}$, ... $4_{NM}$ is electrically connected to a column line $8_1$, $8_2$, ... $8_M$ corresponding to the column in which the cell $2_{11}$, $2_{12}$, ... $2_{NM}$ appears. Although FIG. 1 shows an array composed of one particular type of cell, any of the other cells described herein may be formed in an array similar to that of FIG. 1.

Figure 2:
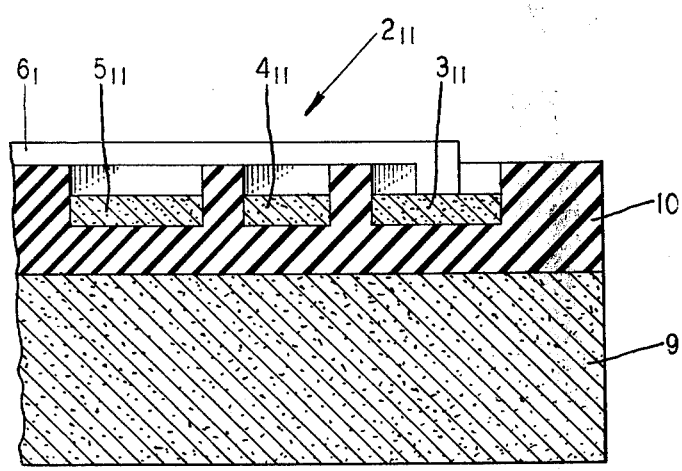
FIG. 2 is a longitudinal sectional view taken along line 2—2' of FIG. 1.

FIG. 2 shows an enlarged longitudinal sectional view taken along the line 2—2' of FIG. 1 and shows the first memory cell $2_{11}$, with its A electrode $3_{11}$, its gate electrode $4_{11}$, and its B electrode $5_{11}$. In FIG. 2, 9 indicates the semiconductor substrate and 10 indicates the insulating layer. The operation of the first cell $2_{11}$ is representative of the operation of each of the cells $2_{11}$, $2_{12}$, ... $2_{NM}$ of FIG. 1.

Figure 3:
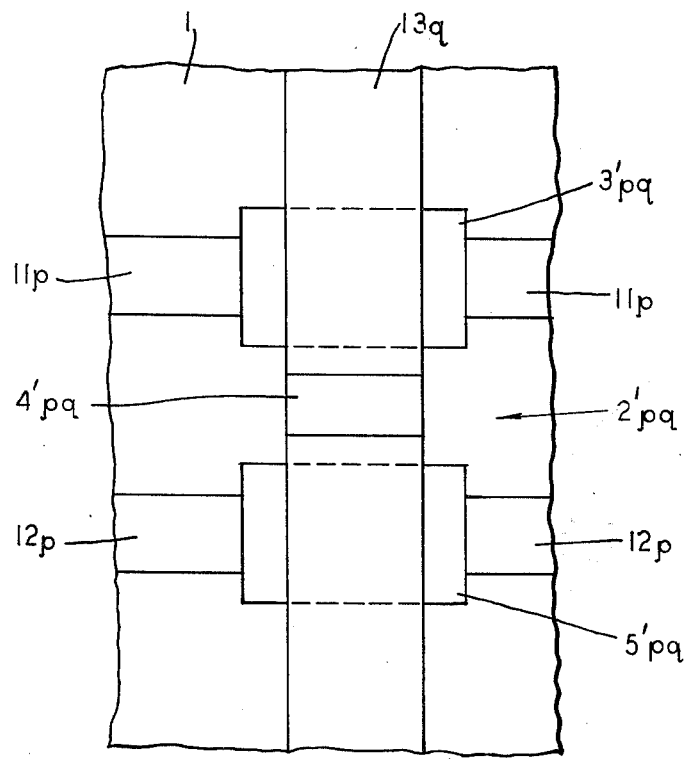
FIG. 3 is a top view of an alternative memory cell which can be operated according to the present invention.

FIG. 3 shows a top view of a portion of a wafer 1 in which an alternative memory cell which can be operated according to this invention is shown. To facilitate the understanding of the operation of this alternative cell once the operation of the first cell shown in FIG. 2 is understood, elements of this alternative cell which are substantially unchanged from this corresponding elements of the first cell will be assigned the same reference numerals as were assigned to the first cell, but said reference numerals will be primed when referring to the alternative cell. In particular FIG. 3 shows the memory cell $2_{pq}'$ appearing in the pth row and the qth column of an array of similar cells. The cell $2_{pq}'$ includes an A electrode $3_{pq}'$, a gate electrode $4_{pq}'$, and a B electrode $5_{pq}'$. The A row line $11_p$ is centered on the A electrode $3_{pq}'$, and the B row line $12_p$ is centered on the B electrode $5_{pq}'$. The column line $13_q$ to which the gate $4_{pq}'$ is connected, is arranged to be directly over, but insulated from, both the A electrode $3_{pq}'$ and the B electrode $5_{pq}'$.

Figure 4:
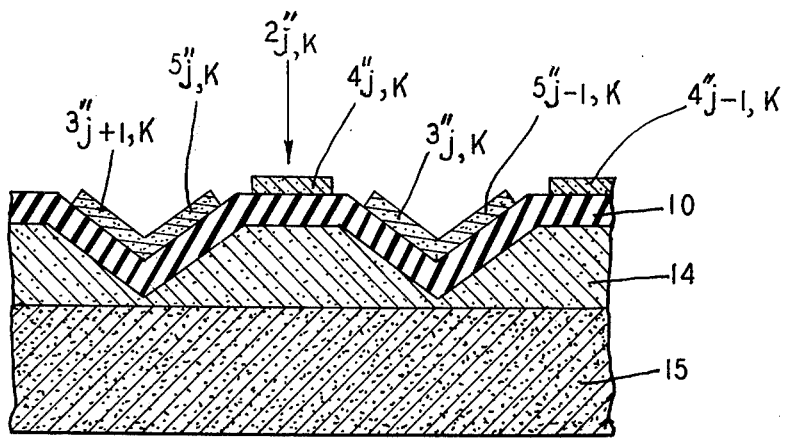
FIG. 4 is a longitudinal sectional view of a second alternative memory cell which can be operated according to the present invention.

FIG. 4 shows an enlarged longitudnal sectional view of a second alternative cell which can be operated according to this invention. To facilitate the understanding of the operation of this second alternative cell once the first cell is understood, elements of this second alternative cell which are substantially unchanged from, or which perform substantially the same function as the corresponding elements of the first cell will be assigned the same reference numerals as were assigned to the first cell, but said reference numerals will be double primed when referring to the second alternative cell. The cell $2_{jk}''$ appearing in the jth row and the kth column of an array of similar cells is shown with its A electrode $3_{jk}''$, its gate electrode $4_{jk}''$, and its B electrode $5_{jk}''$. A portion of the cell $2_{j-1,k}''$ appearing in the j—1 row and the kth column is shown, and in particular its gate electrode $4_{j-1,k}''$ and its B electrode $5_{j-1,k}''$ are shown. Also a portion of the cell $2_{j+1,k}''$ appearing in the j+1 row and the kth column is shown, and in particular its A electrode $3_{j+\pm,k}''$ is shown. In the figure, 10 indicates the insulating layer, 14 indicates a semiconducting layer of one conductivity type and 15 indicates a semiconducting layer of the same conductivity type as, but with a higher density of majority carriers than, the semiconducting layer 14. In the array, special techniques must be used in accessing the gate electrodes so that when one cell is accessed, the two cells appearing in the same column and in adjacent rows are not also accessed.

Figure 5:
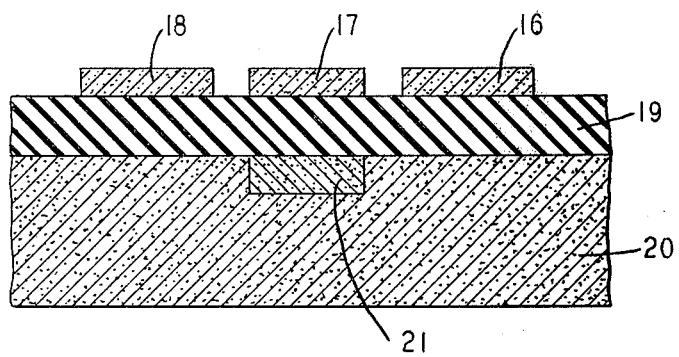
FIG. 5 is a longitudinal sectional view of a third alternative memory cell which can be operated according to the present invention.
Figure 6:
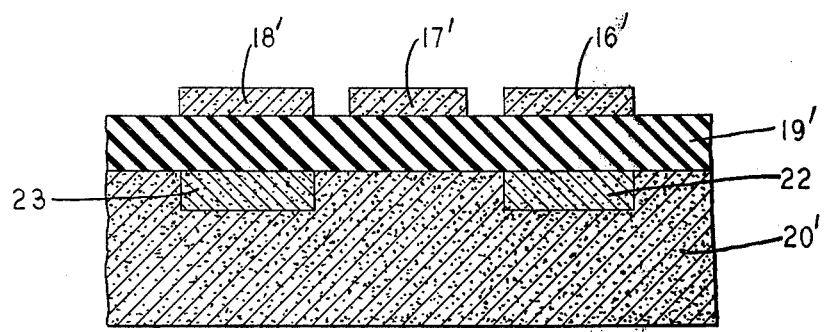
FIG. 6 is a longitudinal sectional view of a fourth alternative memory cell which can be operated according to the present invention.
Figure 7:
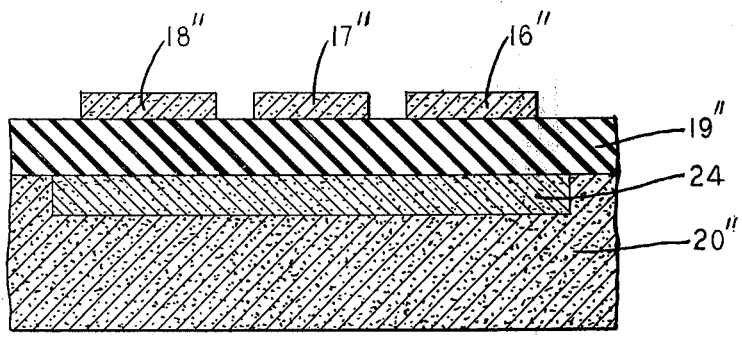
FIG. 7 is a longitudinal sectional view of a fifth alternative memory cell which can be operated according to the present invention.

The memory cells shown in FIG. 5, FIG. 6, and FIG. 7 are sufficiently similar that it is useful to assign the same reference numerals used for elements of FIG. 5 to those corresponding elements in FIG. 6 and FIG. 7 which are essentially unchanged from FIG. 5, but primes will be added to said reference numerals when referring to elements of FIG. 6, and double primes will be added to said reference numerals when referring to elements of FIG. 7.

FIG. 5 shows an enlarged longitudinal sectional view of a third alternative memory cell which can be operated according to this invention. The cell consists of an A electrode 16, a gate electrode 17, a B electrode 18, a layer of insulating material 19, and a semiconducting material of one conductivity type 20. In the figure, 21 indicates a region of semiconducting mateerial of conductivity type opposite to that of the semiconductor substrate 20.

FIG. 6 shows an enlarged longitudinal sectional view of a fourth alternative memory cell which can be operated according to this invention. The cell consists of an A electrode 16', a gate electrode 17', a B electrode 18', a layer of insulating material 19', and a semiconductor substrate of one conductivity type 20'. In the FIGS. 22 and 23 indicate regions of semiconducting material of conductivity type opposite to that of the semiconductor substrate 20'.

FIG. 7 shows an enlarged longitudinal sectional view of a fifth alternative memory cell which can be operated according to this invention. The cell consists of an A electrode 16'', a gate electrode 17'', a B electrode 18'', a layer of insualting material 19'', and a semiconductor substrate 20''. In the FIG. 24 indicates a region of the semiconducting material of conductivity type opposite to that of the semiconductor substrate 20''.

The A electrodes $3_{11}, 3_{12}, \ldots 3_{NM}, 3_{pq}', 3_{jk}'', 3_{j+l,k}'',$ 16, 16', 16'', the B electrodes $5_{11}, 5_{12}, \ldots 5_{NM}, 5_{pq}',$ $5_{j-l,k}'', 5_{jk}''$, 18, 18', 18'' and the gate electrodes $4_{11}, 4_{12}, \ldots 4_{NM}, 4_{pq}', 4_{j-l,k}'', 4_{jk}''$, 17, 17', 17'', the A row lines $6_1, 6_2, \ldots 6_N, 11_p$, the B row lines $7_1, 7_2, \ldots 7_N,$ $12_p$, and the column lines $8_1, 8_2, \ldots 8_M, 13_q$ may all be of aluminum or of any other suitable conductive material such as polysilicon, and all of the above elements need not be of the same conducting material.

The insulating layer 10, 19, 19', 19'' may be of silicon dioxide, silicon nitride, or a combination of the two materials may be used. For example, a layer of silicon dioxide next to the semiconductor substrate 9, a layer of silicon nitride on top of this first layer of silicon dioxide, and in those areas where a relatively thick insulating layer is required, a second layer of silicon dioxide may be used. Or any other suitable insulating material or combination of insulating materials may be used for the insulating layers 10, 19, 19', 19''. Also as will be described, the insulating layers 10, 19, 19', 19'' or selected portions thereof, may be specially doped by diffusion or ion implantation, or otherwise treated by for example using high energy radiation to establish a specific electrical charge in the insulating layers 10, 19, 19', 19'' to facilitate the implementation of this invention. The semiconducting substrate 9, 20, 20' 20'' may be N type silicon, or P type silicon, of any suitable orientation, or any other suitable semiconducting material may be used. In FIG. 4, the semiconducting layer 14 and the semiconducting layer 15 may be of N type silicon, or of P type silicon, or of any other suitable semiconducting material such that the semiconducting layer 14 and 15 are of the same conductivity type, but the semiconducting layer 15 has a higher density of majority carriers than does the semiconducting layer 14. In FIG. 5, FIG. 6, and FIG. 7 the conductivity type of the semiconducting regions 21, 22 and 23, 24 must be opposite to the conductivity type of the semiconductor substrate 20, 20', and 20'' respectively.

In general the fabrication of cells suitable for implementing this invention used well known principles, and the well developed technologies of the integrated circuit industry.

To facilitate the description of this invention, the operation of the single memory cell $2_{11}$, shown in FIG. 2 will be described in detail, and then the operation of an array of such memory cells $2_{11}, 2_{12}, \ldots 2_{NM}$ shown in FIG. 1 will be described. Finally, the operation of the alternative cells shown in FIG. 3, FIG. 4, FIG. 5, FIG. 6, and FIG. 7 will be described.

For ease of discussion, in the following it will be assumed that the semiconductor substrate 9 is N type silicon and that the insulating layer 10 is silicon dioxide. Also the substrate 9 will be maintained at ground potential and all potentials will be measured with respect to the substrate 9. Continuous reference will be made to the depletion regions and inversion regions established in the semiconductor substrate 9 generally beneath the various electrodes $3_{11}, 4_{11}, 5_{11}$ and therefore to avoid repetitious qualifiers, such regions will be referred to as "the (inversion or depletion) region beneath the (specified) electrode," it being understood that the said (inversion or depletion) region is formed in the semiconductor substrate 9 beneath the specified electrode.

According to the present invention, binary data is represented by minority carriers stored in inversion regions established beneath the A and B electrodes $3_{11},$ $5_{11}$. For example a 1 may be represented by maintaining a relatively large number of minority carriers in the inversion region beneath the A electrode $3_{11}$ while maintaining a relatively small number of minority carriers in the inverstion region beneath the B electrode $5_{11}$. A 0 may be represented by maintaining a relatively small number of minority in the inversion region beneath the A electrode $3_{11}$ while maintaining a relatively large number of minority carriers in the inversion region beneath the B electrode $5_{11}$. Alternatively, a 0 may be represented by storing an equal or almost equal number of minority carriers in the inversion regions beneath the A and B electrodes $3_{11}, 5_{11}$. The first method of representing a 0 will be used in the following description of the operation of the cell $2_{11}$.

The specific operations involved in this invention depends on the specific design of the cell $2_{11}$. The cell $2_{11}$ may be designed so that an inversion region exists beneath some or all of the electrodes $3_{11}, 4_{11}, 5_{11}$ when there is no potential difference between said electrodes $3_{11}, 4_{11}, 5_{11}$ and the semiconductor substrate 9. Such inversion regions will hereafter be referred to as equilibrium inversion regions. The techniques for establishing such equilibrium inversion regions are well known in the prior art and include selection of the proper orientation of the semiconductor substrate 9 to control the interface charge density, introducing electronic and ionic charge of the appropriate polarity in to the insulating layer 10, utilizing differences in work functions of the material used for the electrodes $3_{11}, 4_{11}, 5_{11}$ and the semiconductor substrate 9, irradiating the insulating layer 10, and controlling the processing to induce charge of the appropriate polarity in to the insulating layer 10.

To avoid having to apply a potential to the gate electrode $4_{11}$ during operations when the inversion regions beneath the A and B electrodes $3_{11}, 5_{11}$ are required to be isolated from each other, it is necessary that any equilibrium inversion regions exist only beneath the A and B electrodes $3_{11}, 5_{11}$ and not beneath the gate electrode $4_{11}$. Alternatively, equilibrium depletion or inversion regions can be established beneath all the electrodes $3_{11}, 4_{11}, 5_{11}$ and then an appropriate voltage applied to the gate electrode $4_{11}$ to establish a potential barrier between the inversion regions beneath the A and B electrodes $3_{11}$, $5_{11}$ when the inversion regions are to be isolated from each other.

Instead of equilibrium inversion regions, equilibrium depletion regions without inversion regions may be established beneath some or all of the electrodes $3_{11}$, $4_{11}$, $5_{11}$ so that a relatively small potential may be applied to the electrodes $3_{11}$, $4_{11}$, $5_{11}$ to form an inversion region beneath them.

In prior art methods of representing, entering, storing and recalling binary data, such equilibrium inversion regions were usually undesirable, and thus the acceptable materials, orientation of same, and conductivity types used in implementing these prior art methods were restricted. Since in the present invention such equilibrium inversion regions beneath at least some of the electrodes $3_{11}$, $4_{11}$, $5_{11}$ may be desirable, these materials, and these orientations and these conductivity types may be used in the construction of cells for the implementation of the present invention. Other advantages of designing and manufacturing the cell $2_{11}$ so that an equilibrium inversion region is established in the semiconductor substrate 9 beneath some or all of the electrodes $3_{11}$, $4_{11}$, $5_{11}$ will be evident to those skilled in the art. For example, with such equilibrium depletion regions, the cell $2_{11}$ may be operated at lower voltages resulting in generally faster operation and lower power consumption.

For proper operation of the array of cells $2_{11}$, $2_{12}$, . . . $2_{NM}$ it is necessary that the inversion regions of each cell be isolated from the inversion regions of every other cell. Therefore the cell $2_{11}$ must be designed so that during operation inversion regions are not formed in the semiconductor substrate beneath the field oxide or beneath the row lines $6_1$, $6_2$, . . . $6_N$, $7_1$, $7_2$, . . . $7_N$ and the column lines $8_1$, $8_2$, . . . $8_M$.

In the following description of the memory cell $2_{11}$ it will be assumed that no equilibrium inversion regions exist in the semiconductor substrate 9 beneath the electrodes $3_{11}$, $4_{11}$, $5_{11}$. The operation of a cell in which an equilibrium inversion region does exist beneath one or more of the electrodes $3_{11}$, $4_{11}$, $5_{11}$ can be understood by one familiar with the art after reading and understanding the following. The description of the operation of the cell $2_{11}$ is simplified if the A electrode $3_{11}$, the insulating layer 10 generally beneath the A electrode $3_{11}$, and the semiconductor substrate 9 generally beneath the A electrode $3_{11}$ are substantially the same as the B electrode $5_{11}$, the insulating layer 10 generally beneath the B electrode $5_{11}$, and the semiconductor substrate 9 generally beneath the B electrode $5_{11}$, respectively. The above stated conditions will therefore be assumed in the following description of the cell $2_{11}$.

The cell $2_{11}$ may be initialized by establishing an inversion region in the semiconductor substrate 9 beneath either the A electrode $3_{11}$, the B electrode $5_{11}$, or the gate electrode $4_{11}$, or beneath any combination of these electrodes, by applying an appropriate voltage to the selected electrode(s), and collecting thermally generated minority carriers in the depletion region(s) so established. After a sufficient number of minority carriers have been collected, these carriers are maintained in the cell $2_{11}$ by applying a voltage $V_r$ to both the A electrode $3_{11}$ and to the B electrode $5_{11}$ so as to establish inversion regions beneath said electrodes. Each of these inversion regions must be capable of storing the number of minority carriers required for operation of the cell $2_{11}$. Furthermore, the A and B electrodes $3_{11}$, $5_{11}$ and the voltage $V_r$ must be such that the inversion region beneath the A electrode $3_{11}$ is isolated from the inversion region beneath the B electrode $5_{11}$.

Using this invention, unlike may prior art methods, a relatively constant amount of stored charge is maintained in the cell $2_{11}$ regardless of whether a 1 or a 0 is stored therein. Thus once a sufficient number of minority carriers have been collected in the depletion regions of the cell $2_{11}$ there is no need for any further injection of minority carriers or extraction of minority carriers from the cell $2_{11}$. This feature of the present invention permits improved performance by simplifying the requirements on the cell $2_{11}$, reducing the area of the cell $2_{11}$, reducing the external circuitry required to operate the memory cell $2_{11}$, reducing the power consumption of the cell $2_{11}$, and permitting faster cycle times.

In subsequent operations, it will be necessary to transfer some or almost all of the minority carriers stored in the inversion region beneath the A electrode $3_{11}$ to the inversion region beneath the B electrode $5_{11}$, and conversely to transfer some or almost all of the minority carriers in the inversion region beneath the B electrode $5_{11}$ to the inversion region beneath the A electrode $3_{11}$. To accomplish this minority carrier transfer it is necessary to form a minority carrier channel from the inversion region beneath the A electrode $3_{11}$ to the inversion region beneath the B electrode $5_{11}$. The gate electrode $4_{11}$ is designed such that when an appropriate voltage $V_g$ is applied to the gate electrode $4_{11}$, an inversion region is formed beneath the gate electrode $4_{11}$ such that the inversion region beneath the gate electrode $4_{11}$ intersects both the inversion region beneath the A electrode $3_{11}$ and the inversion region beneath the B electrode $5_{11}$. Operation of the cell is enhanced if the invertion region so formed beneath the gate electrode $4_{11}$ is capable of storing a relatively small number of minority carriers compared to the number of minority carriers stored in the inversion regions beneath the A electrode $3_{11}$ or beneath the B electrode $5_{11}$, by for example designing the gate electrode $4_{11}$ and selecting the voltage $V_g$ so that the extent of the inversion region beneath the gate electrode $4_{11}$ when $V_g$ is applied to the gate electrode $4_{11}$ is smaller than the extent of the inversion regions beneath the A and B electrodes $3_{11}$, $5_{11}$, while still fulfilling the requirements specified above.

When data is being retained by the cell $2_{11}$, the potential on the gate electrode $4_{11}$ is maintained at a value such that the inversion region, if any exists, beneath the gate electrode $4_{11}$ does not simultaneously intersect both the inversion regions beneath the A and B electrodes $3_{11}$, $5_{11}$. With the assumptions previously stated, this may be accomplished by grounding the gate electrode $4_{11}$.

To enter a 1 in the cell $2_{11}$, a voltage $V_1$ is applied to the A electrode $3_{11}$ and a voltage $V_o$ is applied to the B electrode $5_{11}$ forming inversion regions beneath both electrodes $3_{11}$, $5_{11}$ such that the surface potential at the interface between the semiconductor substrate 9 and the insulating layer 10 beneath the A electrode $3_{11}$ is substantially more negative than the surface potential at the interface between the semiconductor substrate 9 and the insulating layer 10 beneath the B electrode $5_{11}$. A minority carrier channel between the inversion region beneath the A electrode $3_{11}$ and the inversion region beneath the B electrode $5_{11}$ is formed by applying the voltage $V_g$ to the gate electrode $4_{11}$. Most of the minority carriers in the cell $2_{11}$ will therefore accumulate in the inversion region beneath the A electrode $3_{11}$. After most of the minority carriers have accumulated in the inversion region beneath the A electrode $3_{11}$, the minority carrier channel is extinguished, as described above, by for example grounding the gate electrode $4_{11}$. Then the potential $V_r$ is reestablished on both the A and B electrodes $3_{11}$, $5_{11}$.

To enter a 0 in the cell $2_{11}$ a procedure similar to that just described for entering a 1 in the cell $2_{11}$ may be used, except that the voltage $V_1$ is applied to the B electrode $5_{11}$ and the voltage $V_o$ is applied to the A electrode $3_{11}$.

The binary data so entered in the cell $2_{11}$ is maintained therein by maintaining the voltage $V_r$ on both the A and B electrodes $3_{11}$, $5_{11}$, and maintaining the potential on the gate electrode $4_{11}$ such that a minority carrier channel is not formed between the inversion region beneath the A electrode $3_{11}$ and the inversion region beneath the B electrode $5_{11}$.

To recall the bit stored in the cell $2_{11}$, either the A electrode $3_{11}$ or the B electrode $5_{11}$ or both, are connected to the input or inputs of an appropriate sense circuit, and the voltage source $V_r$ removed from both the A electrode $3_{11}$ and the B electrode $5_{11}$, leaving these electrodes charged at substantially the potential $V_r$. Then the voltage $V_g$ may be applied to the gate electrode $4_{11}$, forming a minority carrier channel between the inversion region beneath the A electrode $3_{11}$ and the inversion region beneath the B electrode $5_{11}$. If the cell $2_{11}$ contains a 1, some of the large number of minority carriers stored in the inversion region beneath the A electrode $3_{11}$ flow through the minority carrier channel to the inversion region beneath the B electrode $5_{11}$. As a result of this minority carrier redistribution, the potential on the A electrode $3_{11}$ decreases (goes more negative), and the potential on the B electrode $5_{11}$ increases (goes less negative). If the cell $2_{11}$ contains a 0 some of the large number of minority carriers stored in the inversion region beneath the B electrode $5_{11}$ flow through the minority carrier channel to the inversion region beneath the A electrode $3_{11}$. As a result of the minority carrier redistribution, the potential on the B electrode $5_{11}$ decreases (goes more negative), and the potential on the A electrode $3_{11}$ increases (goes less negative). The potential change on the A electrode $3_{11}$, or on the B electrode $5_{11}$, or on both may be used to control the output of a sense circuit. Thus the value of the bit stored in the cell $2_{11}$ may be determined.

In all of the above operations, the requirements on the completeness of charge transfer are much less stringent than those of typical SR type memories which utilize charge transfer devices. These less stringent requirements are an inherent characteristic of this invention just as the stringent requirements are an inherent property of extensive SR memories. Therefore using the present invention, the potentially fast operating speeds of charge transfer devices when operated in a mode not requiring almost complete charge transfer, may be utilized.

Another advantage of this invention over prior art methods used in operating dynamic memory cells is that the method of this invention provides a differential output from the cell $2_{11}$ when it is read. This feature permits most of any noise voltages that are common to both the A and B electrodes $3_{11}$, $5_{11}$ to be cancelled at the input of the sense circuit. To utilize this differential output, a bistable sense circuit with differential inputs may be used. The use of such a sense circuit will be assumed in the following.

The read operation just described above is destructive since after opening the minority carrier channel between the inversion region beneath the A electrode $3_{11}$ and the inversion region beneath the B electrode $5_{11}$, the number of minority carriers in the two said inversion regions tends to be equalized. However with a properly designed cell $2_{11}$ and sense circuit, the "pull up" of the sense circuit can be used to automatically reenter the bit in the cell $2_{11}$. This feature is well established in the prior art and is used to reenter the stored bit after reading in some prior art dynamic RAM cells. However, since only a small amount of charge need be transferred to the A electrode $3_{11}$ and to the B electrode $5_{11}$ to reenter the bit stored in the cell $2_{11}$, the requirements on the sense circuit are minimal and compared to prior art methods, this invention permits faster reentering of data.

Alternatively, a circuit distinct from the sense circuit may be used to reenter the bit following the read operation.

Periodically the bit stored in the cell $2_{11}$ must be refreshed because minority carriers generated in and near the depletion regions of the cell $2_{11}$ may accumulate in that inversion region in which a low density of minority carriers is stored. If the cell $2_{11}$ and the sense circuit are properly designed, the read operation can be used to refresh the cell $2_{11}$. For example if a 1 is stored in the cell $2_{11}$, any thermally generated minority carriers collected in the inversion region beneath the B electrode $5_{11}$ during the interval while the cell was retaining this 1 can be transferred to the inversion region beneath the A electrode $3_{11}$ when the bit is reentered, as was described above. This removes the excess minority carriers from the inversion region beneath the B electrode $5_{11}$ where their presence degrades the performance of the cell $2_{11}$. Once these excess minority carriers are in the inversion region beneath the A electrode $3_{11}$, they can be recombined with majority carriers from the semiconductor substrate 9 as follows. After the minority carrier channel beneath the gate electrode $4_{11}$ is closed and the voltage $V_r$ is reestablished on the A and B electrodes $3_{11}$, $5_{11}$, the excess minority carriers in the inversion region beneath the A electrode $3_{11}$ causes the depletion region beneath the A electrode $3_{11}$ to be smaller in extent than it would otherwise be. With a properly designed cell $2_{11}$ the depletion region will still exist beneath the A electrode $3_{11}$ so that minority carriers stored therein do not flow to nearby depletion regions, but there will be slight overlap between the spatial distribution of electrons near the depletion region beneath the A electrode $3_{11}$ and the spatial distribution of minority carriers within the inversion region beneath the A electrode $3_{11}$. Recombination can occur at this overlap, eliminating at least some of the excess minority carriers. As these excess minority carriers are eliminated, the extent of the depletion region beneath the A electrode $3_{11}$ increases and the above mentioned overlap decreases until eventually a steady state situation is established.

Still considering the example when a 1 is stored in the cell $2_{11}$, a careful analysis of the read operation will demonstrate that a slight excess of minority carriers in the inversion region beneath the A electrode $3_{11}$ improves the output of the cell $2_{11}$ when the data stored therein is recalled. Therefore it is not necessary that all the excess minority carriers recombine before the cell $2_{11}$ may be used.

By symmetry similar considerations apply to the refresh operation when the cell $2_{11}$ contains a 0.

Although a particular cell, constructed from a particular semiconducting material of a particular conductivity type and a particular insulating material has been used in the description of this invention, this invention may also be used in different cells, or in cells constructed from different semiconducting material and with either N or P type conductivity semiconducting material, and with different insulating material.

In the array of cells $2_{11}$, $2_{12}$, ... $2_{NM}$ shown in FIG. 1, an entire column of cells $2_{1g}$, $2_{2g}$, ... $2_{Ng}$ is accessed simultaneously for the purpose of entering or recalling binary data. Therefore a separate sense circuit must be provided for each row in the array. In the array of FIG. 1 the method of representing, entering, storing, recalling, and refreshing binary data is the same as were described for the single cell $2_{11}$ except that the said operations are performed on a column of cells $2_{1g}$, $2_{2g}$, ... $2_{Ng}$ simultaneously, and the voltage $V_o$ must be selected so that when any of the A row lines $6_1$, $6_2$, ... $6_N$ or any of the B row lines $7_1$, $7_2$, ... $7_N$ are at the potential $V_o$ data is not lost in any cell in the array of cells $2_{11}$, $2_{12}$, ... $2_{NM}$. For example if a 1 is being entered or reentered in the cell $2_{rs}$ located at the rth column and the sth row, then $V_o$ will be applied to the rth B row line $7_r$. Consequently $V_o$ will be applied to all the B electrodes $5_{r1}$, $5_{r2}$, ... $5_{rM}$ in the rth row. Since 0's may be stored in some of the cells $2_{r1}$, $2_{r2}$, ... $2_{rM}$ a large number of minority carriers may be stored in the inversion regions beneath some of the B electrodes $5_{r1}$, $5_{r2}$, ... $5_{rM}$. Therefore $V_o$ must be selected so that when applied to these B electrodes $5_{r1}$, $5_{r2}$, ... $5_{rM}$ a depletion region is established such that the number of minority carriers required for the operation of the cells $2_{11}$, $2_{12}$, ... $2_{NM}$ may be stored therein. Since the potential $V_o$ will remain on the B electrodes $5_{r1}$, $5_{r2}$, ... $5_{rM}$ for a short interval of time, a transient depletion region of lesser extent than a steady state depletion region may suffice. Similar considerations apply to the A electrodes $3_{r1}$, $3_{r2}$, ... $3_{rM}$ when a 0 is being entered or reentered.

By proper design of the cell and of the sense circuits, the array of cells $2_{11}$, $2_{12}$, ... $2_{NM}$ can be operated from only one potential supply.

FIG. 3 shows a particularly compact layout for a memory cell which can be used in this invention. In addition to requiring a minimum of wafer 1 surface area per cell, the loading capacitance of the A and B row lines $11_p$, $12_p$ is minimized in the layout shown. The increased capacitive coupling between the column line $13_q$ and the A and B electrodes $3_{pq}'$, $5_{pq}'$ may be acceptable using the present invention because the differential output of the cell $2_{pq}'$ permits most of the effects of any capacitively coupled signals to be minimized. The cell of FIG. 3 is an example of how with the use of the present invention improved cell layouts are possible.

FIG. 4 shows a second alternative layout for a memory cell that can be used in this invention. The semiconductor substrate 14 is etched using an etching solution which etches at different rates in different crystallographic directions to form the V grooves in the surface of the semiconductor substrate 14. FIG. 4 represents a typical cell in an array of similar cells and in particular FIG. 4 shows how the cell packing density can be maximized by forming the A and B electrodes $3_{jk}''$, $5_{jk}''$ at an angle to the horizontal and by eliminating the usualy required spacing between neighboring A and B electrodes $3_{jk}''$, $5_{j-1,k}''$. In the figure the A electrode $3_{jk}''$ is formed on one leg of a V-groove and the B electrode $5_{j-1,k}''$ is formed on the other leg of the same V-groove.

The inversion region formed beneath the A electrode $3_{jk}''$ must be isolated from the inversion region formed beneath the B electrode $5_{j-1,k}''$ and any of the following techniques, or any combination of the following techniques may be utilized to provide the required isolation. In all three techniques, the said isolation is provided by insuring that the magnitude of the surface potential at the interface between the insulating layer 10 and the semiconducting layer 14 is smaller at the nadir of the V-groove than it is at the legs of the V-groove. In the first technique for providing the said isolation, the high conductivity semiconductor layer 15 is used to restrict the extent of the depletion region in the vicinity of the nadir of the V-groove, and therefore reduce the magnitude of the surface potential at the nadir of the V-groove compared to nearby regions. In the second technique, the divergence of the electric field lines emanating from the nadir of the conductive material in the V-groove is used to insure that the magnitude of the surface potential at the nadir of the V-groove is less than it is in nearby regions. In the third technique the increased thickness of the insulating layer 10 at the nadir of the V-groove compared to the thickness of the insulating layer 10 along the sides of the V-groove is used to insure that the magnitude of the surface potential at the nadir of the V-groove is less than it is in nearby regions.

If the cell shown in FIG. 4 is used to form an array, special attention must be given to the interconnection of the cells to insure that when accessing one particular cell the two cells in the same column as but adjacent rows to the cell of interest are not also accessed. For example, in a given column of cells, the gate electrodes of every other cell may be connected in common.

The present invention can also be used with cells constructed as shown in FIG. 5, FIG. 6, and FIG. 7. In these cells semiconducting regions of both conductivity types are present and so to facilitate the description of the operation of these cells according to the present invention, in the following discussion it will be assumed that the semiconducting regions 20, 20', 20" are N type, and therefore the semiconducting regions 21, 22, 23, and 24 are P type. The present invention may also be used with the cells of FIG. 5, FIG. 6, and FIG. 7 if they are constructed such that the semiconducting regions 20, 20', 20" are P type and the semiconducting regions 21, 22, 23, and 24 are N type, and under such conditions the operation of these cells according to this invention can be understood by those skilled in the art who have read and understood the following description of the operation of said cells.

According to this invention, the memory cell shown in FIG. 5 may be operated as follows. Inversion regions are established beneath the A electrode 17 and beneath the B electrode 18 by applying the appropriate potentials thereto, or equilibrium inversion regions may be established beneath the A and B electrodes 16, 18. A large number of holes are stored in one of these two inversion regions and a small number of holes stored in the other inversion region to represent one value of a binary valued variable, and just the opposite condition is used to represent the alternative value of the binary valued variable. The potential on the gate electrode 17 is controlled so as to either establsih a channel through which holes can flow between the inversion regions beneath the A electrode 16 and beneath the B electrode 18, or to establish a potential barrier beneath the gate electrode 17 so as to restrict the flow of holes between the inversion regions beneath the A electrode 16 and the inversion region beneath the B electrode 18. The cell shown in FIG. 5 therefore contains all the features used in describing the operation of the cell shown in FIG. 2. The description of the enter, store, recall, and refresh operations of the cell of FIG. 5 when operated according to the present invention is very similar to the description of those operations presented for the Cell of FIG. 2 and will not be repeated.

Additional features of the cell of FIG. 5 are:
1. the semiconducting region 21 can be used as a source of the holes required for operation of the cell, and
2. the semiconducting region 21 may be designed to insure that any potential hills occurring at the intersection of the channel formed beneath the gate electrode 17 and the inversion regions beneath the A and B electrodes 16, 18 are minimized, especially if the well known self alignment procedures are used in establishing the region 21.

However, the presence of of semiconductor region 21 may reduce the maximum interval between refresh cycles. For reliable operation the semiconducting region 21 should be sufficiently thin so that it can be almost completely depleted of holes by applying an appropriate potential to the gate electrode 17.

In the cell shown in FIG. 6, and with the assumptions described above, binary data is represented by alternatively storing in one of the regions 22, 23 an excess of holes; in the other said region a deficiency of holes is maintained. Accumulation regions rather than depletion regions are used to store these holes. The potential on the gate electrode 17' is controlled so as to either establish a channel between the regions 22 and 23 through which holes can flow between the regions 22 and 23 as required when entering and recalling data, or to establish a potential barrier between the regions 22 and 23 to restrict the flow of holes between regions 22 and 23 as required when storing binary data. Again when used according to this invention, the operations involved in entering, storing, recalling, and refreshing binary data in the cell of FIG. 6 are very similar to those described for the cell of FIG. 2, and will not be repeated. Additional features of the cell of FIG. 6 are:
1. under present technological constraints a significently larger signal may be obtained when the data stored in the cell of FIG. 6 is recalled than is possible from cells in which depletion regions are used to store minority carriers,
2. the regions 22 and 23 serve to define and restrict the storage regions, thus permitting more dense packing of the cells, and
3. the holes required for the cell's operation can be obtained from the regions 22 and 23.

Although in construction, the cell of FIG. 6 appears very similar to a field effect transistor, its operation is significently different.

In the cell of FIG. 7 binary data is again represented by storing a large number of holes in the accumulation region established beneath one of the electrodes 16", 18", and maintaining a deficiency of holes in the accumulation region beneath the other of said electrodes.

The potential on the gate electrode 17" is again controlled to provide either a channel for holes to flow between the accumulation regions beneath the A and B electrodes 16", 18", or to establish a potential barrier to restrict the flow of holes between the accumulation regions beneath the A and B electrodes 16", 18". When operating the cell of FIG. 7 according to this invention, the enter, store, recall, and refresh operations are very similar to those described in the operation of the cell of FIG. 2, and will not be repeated. Additional features of the cell of FIG. 7 include:
1. large output signals may be obtained from the cell since accumulation regions are used to store charge,
2. dense packing is possible because the storage regions are defined and restricted by the boundaries of region 24, and
3. the holes required for the operation of the cell can be obtained from the region 24.

The semiconducting region 24 must be sufficiently thin so that most of the holes therein can be stored in either the accumulation region beneath the A electrode 16" or in the accumulation region beneath the B electrode 18".

The present invention can be used with semiconductor devices manufactured using the techniques and processes developed to manufacture high density integrated circuits. Metal insulator field effect transistors may be incorporated into the same semiconductor substrate as is used for the memory cells to implement the address decoding and construct the sense circuits required for recalling and refreshing the data in the cells.

It is to be understood that the particular cells used to describe the present invention and the particular sequence of steps used in applying this invention are to be taken as preferred embodiments. Various other cells can be used with this invention, and various changes can be made in the sequence and nature of the steps used in applying this invention. Improvements and variations in the cells described herein, such as using different thicknesses of the insulating layer beneath the electrodes to permit overlapping of the metalization, and other techniques and procedures well established in the prior art may be used to enhance the performance or simplify the manufacture of cells operated according to this invention.

I claim:
1. A method of representing, entering, and storing the value of a binary valued variable in a semiconductor memory cell, comprising the steps of:
 a. utilizing a first electrode in proximity to a semiconducting material to establish for charge carriers of one polarity a first localized minimum potential energy region in said semiconducting material,
 b. utilizing a second electrode in proximity to the said semiconducting material to establish for said polarity of charge carriers, a second localized minimum potential energy region in said semiconducting material,
 c. representing the first possible value of said binary valued variable in the said memory cell by storing a relatively large number of charge carriers of said polarity in said first localized minimum potential energy region and storing a relatively small number of charge carriers of said polarity in said second localized minimum potential energy region, d. representing the second possible value of said binary valued variable in the said memory cell by storing a relatively large number of charge carriers of said polarity in said second localized minimum potential energy region and storing a relatively small number of charge carriers of said polarity in said first localized minimum potential energy region, e. entering the first possible value of said binary valued variable in the said memory cell by altering the number of charge carriers of said polarity stored in said first and said second localized minimum potential energy regions such that the aforementioned conditions for representing the first possible value of the said binary valued variable in said memory cell are established, f. entering the second possible value of said binary valued variable in said memory cell by altering the number of charge carriers of said polarity stored in said first and said second localized minimum potential energy regions such that the aforementioned conditions for representing the second possible value of the said binary valued variable in said memory cell are established, g. storing the value of the said binary valued variable so entered in the said memory cell by maintaining said first and said second localized minimum potential energy regions in said semiconducting material and maintaining the ratio of the number of charge carriers of said polarity stored in the said first localized minimum potential energy region to the number of charge carriers of said polarity stored in the said second localized minimum potential energy region at substantially the same value established for said ratio when the said value of the binary valued variable was entered in said memory cell.

2. The method of claim 1 of representing, entering, and storing the value of a binary valued variable in a memory cell and a method of determining the value of the said binary valued variable stored in the said memory cell comprised of changing the number of said charge carriers of said polarity stored in said first localized minimum potential energy region.

3. The methods of claim 2 in which during the process of determining the value of the said binary valued variable stored in the said memory cell, the change in potential on the said first electrode resulting from the said change in the number of said charge carriers of said polarity stored in the said first localized minimum potential energy region is detected to determine the said value of said binary valued variable stored in the said memory cell.

4. The method of claim 1 of representing, entering, and storing the value of a binary valued variable in a memory cell and a method of determining the value of the said binary valued variable stored in the said memory cell, comprised of changing the number of said charge carriers of said polarity stored in said second localized minimum potential energy region.

5. The methods of claim 4 in which during the process of determining the value of the said binary valued variable stored in the said memory cell, the change in potential on the said second electrode resulting from the said change in the number of said charge carriers of said polarity stored in the said second localized minimum potential energy region is detected to determine the said value of said binary valued variable stored in the said memory cell.

6. The methods of claim 1 of representing, entering, and storing the value of a binary valued variable in a memory cell, and a method of determining the value of the said binary valued variable so stored in the said memory cell, comprised of altering the number of charge carriers of said polarity stored in said first and in said second localized minimum potential energy regions such that the number of charge carriers of said polarity in said first localized minimum potential energy region is made more nearly equal to the number of charge carriers of said polarity in said second localized minimum potential energy region.

7. The methods of claim 12 in which during the process of determining the value of the said binary valued variable stored in the said memory cell, the change in potential on the said first electrode resulting from the said change in the number of said charge carriers of said polarity stored in the said first and said second localized minimum potential energy regions, is detected to determine the said value of said binary valued variable stored in the said memory cell.

8. The methods of claim 6 in which during the process of determining the value of the said binary valued variable stored in the said memory cell, the change in potential on the said second electrode resulting from the said change in the number of said charge carriers of said polarity stored in the said first and said second localized minimum potential energy regions, is detected to determine the said value of said binary valued variable stored in the said memory cell.

9. The methods of claim 6 in which during the process of determining the value of the said binary valued variable stored in the said memory cell, the change in potential on both the said first electrode and on the said second electrode resulting from the said change in the number of said charge carriers of said polarity stored in the said first and said second localized minimum potential energy regions, is detected to determine the said value of said binary valued variable stored in the said memory cell.

10. A method of representing, entering, and storing the value of a binary valued variable in a semiconductor memory cell, comprising the steps of:

a. utilizing a first electrode in proximity to a semiconducting material to establish for charge carriers of one polarity a first localized minimum potential energy region is said semiconducting material, b. utilizing a second electrode in proximity to the said semiconducting material to establish for said polarity of charge carriers, a second localized minimum potential energy region in said semiconducting material, c. representing the first possible value of said binary valued variable in the said memory cell by storing a relatively large number of charge carriers of said polarity in said first localized minimum potential energy region and storing a relatively small number of charge carriers of said polarity in said second localized minimum potential energy region, d. representing the second possible value of said binary valued variable in the said memory cell by storing a substantially equal number of charge carriers of said polarity in said first and in said second localized minimum potential energy regions, e. entering the first possible value of said binary valued variable in the said memory cell by altering the number of charge carriers of said polarity stored in said first and said second localized minimum potential energy regions such that the aforementioned conditions for representing the first possible value of the said binary valued variable in said memory cell are established, f. entering the second possible value of said binary valued variable in said memory cell by altering the number of charge carriers of said polarity stored in said first and said second localized minimum potential energy regions such that the aforementioned conditions for representing the second possible value of the said binary valued variable in said memory cell are established, g. storing the value of the said binary valued variable so entered in the said memory cell by maintaining said first and said second localized minimum potential energy regions in said semiconducting material and maintaining the ratio of the number of charge carriers of said polarity stored in the said first localized minimum potential energy region to the number of charge carriers of said polarity stored in the said second localized minimum potential energy region at substantially the same value established for said ratio when the said value of the binary valued variable was entered in said memory cell.

* * * * *